US007122942B2

(12) United States Patent
Song et al.

(10) Patent No.: US 7,122,942 B2
(45) Date of Patent: Oct. 17, 2006

(54) ELECTROSTATIC RF MEMS SWITCHES

(75) Inventors: In-sang Song, Seoul (KR); Young-il Kim, Suwon (KR); Moon-chul Lee, Sungnam (KR); Dong-ha Shim, Seoul (KR); Young-tack Hong, Suwon (KR); Sun-hee Park, Yongin (KR); Kuang-woo Nam, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 76 days.

(21) Appl. No.: 10/951,612

(22) Filed: Sep. 29, 2004

(65) Prior Publication Data

US 2005/0040486 A1 Feb. 24, 2005

Related U.S. Application Data

(62) Division of application No. 10/643,882, filed on Aug. 20, 2003, now abandoned.

(30) Foreign Application Priority Data

Aug. 20, 2002 (KR) .............................. 2002-49319

(51) Int. Cl.
*H01L 41/08* (2006.01)

(52) U.S. Cl. ...................................... 310/328; 310/330

(58) Field of Classification Search ................ 310/328, 310/330
See application file for complete search history.

(56) References Cited

U.S. PATENT DOCUMENTS

| | | | | |
|---|---|---|---|---|
| 5,772,322 | A | 6/1998 | Burns et al. | |
| 6,143,997 | A | 11/2000 | Feng et al. | |
| 6,271,052 | B1 | 8/2001 | Miller et al. | |
| 6,407,482 | B1 * | 6/2002 | Sakata et al. | 310/328 |
| 6,426,687 | B1 | 7/2002 | Osborn | |
| 6,529,093 | B1 | 3/2003 | Ma | |
| 6,602,427 | B1 | 8/2003 | Tu | |
| 6,713,314 | B1 * | 3/2004 | Wong et al. | 438/25 |
| 2002/0008444 | A1 * | 1/2002 | Sakata et al. | 310/328 |
| 2002/0171121 | A1 | 11/2002 | Ozgur | |
| 2003/0006868 | A1 | 1/2003 | Aigner et al. | |
| 2004/0157367 | A1 * | 8/2004 | Wong et al. | 438/106 |
| 2004/0183402 | A1 * | 9/2004 | Mizuyama et al. | 310/328 |
| 2004/0211654 | A1 * | 10/2004 | Park | 200/10 |
| 2005/0046541 | A1 * | 3/2005 | Fouillet | 337/333 |
| 2005/0225921 | A1 * | 10/2005 | Nakatani et al. | 361/160 |
| 2006/0017533 | A1 * | 1/2006 | Jahnes et al. | 335/78 |

FOREIGN PATENT DOCUMENTS

| | | |
|---|---|---|
| EP | 0 923 099 | 6/1999 |
| WO | WO 94/18688 | 8/1994 |
| WO | WO 01/57901 | 8/2001 |

* cited by examiner

*Primary Examiner*—Thomas M. Dougherty
(74) *Attorney, Agent, or Firm*—Lee & Morse, P.C.

(57) ABSTRACT

A micro switch having a dielectric layer having a movement region formed on a substrate, a conductive layer formed on a predetermined portion of the movement region, a dielectric film formed on the conductive layer, first and second electric conductors formed a predetermined distance above the dielectric film, one or two lower electrodes formed on the movement region, and one or two upper electrodes formed a predetermined distance above the two lower electrodes, the one or two upper electrodes moving the conductive layer and the dielectric film upwards when an electrostatic force occurs between the upper and lower electrodes, and capacitively coupled with the first and second electric conductors to allow a current to flow between the first and second electric conductors. Such a micro switch has a high on/off ratio and isolation degree and a simple structure, and can be fabricated in a very easy process.

13 Claims, 9 Drawing Sheets

ELECTROSTATIC RF MEMS SWITCHES

This application is a DIVISION of application Ser. No. 10/643,882, filed Aug. 20, 2003 now abandoned.

BACKGROUND OF THE INVENTION

1. Field of the Invention

The present invention relates to micro switches. More particularly, the present invention relates to Radio Frequency Micro-Electro Mechanical Systems (RF MEMS) micro switches, which use an electrostatic force for driving thereof.

2. Description of the Prior Art

In general, frequency separators (F/S's), field effect transistors (FETs), PIN diode switches, and so on, for high-frequency signal switches are used to control electric signals, e.g., for closing, restoring, and switching electric circuits in electronic systems.

However, drawbacks associated with the devices above include a low frequency separation degree in the F/S and a high insertion loss, low isolation, high power consumption, etc., in the semiconductor switches. Currently, micro switches for high frequency signals are used to make up for such drawbacks.

Micro switches for high-frequency signals are classified into resistively coupled (RC) switches and capacitively coupled (CC) switches based on a switching coupling method.

The micro switches are further classified into a cantilever type and a bridge type based on structural features of hinge parts thereof. The micro switches are also classified into a shunt-type and a series-type based on a high frequency signal switching method.

The operation principle of micro switches is to actuate hinge parts of a micro switch structure using electrostatic force, magnetostatic force, oscillation of piezoelectric element, and the like, as energy sources to turn signal terminal contact portions on and off. The micro switches are also classified into an electrostatic actuation type and a piezoelectric actuation type based on a driving method.

The conventional shunt-type micro switch described above has a structure in which signal terminals simultaneously play an electrode role of generating electrostatic forces, and input signal terminals and output signal terminals are connected to each other when the switch is in an off-state. Further, when the switch is in an on-state, a signal terminal and a ground terminal are short-circuited so that the output of an input signal is cut off. The shunt-type micro switch has a simple structure, but the switch suffers from a low isolation degree and on/off ratio.

The conventional series-type micro switch described above is a relay switch that completely separates input and output signal terminals from upper and lower electrodes generating an electrostatic force, in which, when the switch is in an off-state, the input and output signal terminals are completely disconnected so that an output for an input signal is cut off. Further, when the switch is in an on-state, the input and output signal terminals are connected so that an input signal is outputted. The series-type micro switch has a high isolation degree and on/off ratio, but drawbacks of the switch include a complex structure, a very difficult process, and a structure that is easily deformed.

SUMMARY OF THE INVENTION

In an effort to solve the problems described above, it is a feature of an embodiment of the present invention to provide a series-type micro switch which has a high on/off ratio and isolation degree, a simple structure, and can be easily fabricated in a very simple process.

In an effort to provide these and other features, a micro switch is provided, including a substrate, a dielectric layer formed on the substrate, the dielectric layer having a movement region formed of a predetermined portion of the dielectric layer that is capable of moving up and down by hinge parts formed on either side of the movement region, a conductive layer formed on a predetermined portion of the movement region, a dielectric film formed on the conductive layer, first and second electric conductors formed a predetermined distance above the dielectric film, two lower electrodes formed on the movement region, and two upper electrodes formed a predetermined distance above the two lower electrodes, the two upper electrodes causing the conductive layer and the dielectric film to move upwards when an electrostatic force occurs between the upper electrodes and the lower electrodes, and capacitively coupled with the first and second electric conductors to allow a current signal to flow between the first and second electric conductors.

Preferably, a portion of the substrate positioned under the movement region, a portion of the dielectric layer surrounding the movement region except where the hinge parts are formed, and a portion of the substrate positioned under a portion of the dielectric layer surrounding the movement region, are selectively etched to provide an etched region for allowing the movement region to move up and down.

Preferably, the lower electrodes are respectively formed between the conductive layer and the hinge parts, and anchors respectively supporting the electric conductors and the upper electrodes may be further included.

In an effort to provide another feature of an embodiment of the present invention, a micro switch is provided, including a substrate, a dielectric layer formed on the substrate, the dielectric layer having a movement region formed of a predetermined portion of the dielectric layer that is capable of moving up and down by a hinge part formed on one side of the movement region, a conductive layer formed on a predetermined portion of the movement region, a dielectric film formed on the conductive layer, first and second electric conductors formed a predetermined distance above the dielectric film, a lower electrode formed on the movement region, and an upper electrode formed a predetermined distance above the lower electrode, the upper electrode causing the conductive layer and the dielectric film to move upwards when an electrostatic force occurs between the upper electrode and the lower electrode, and capacitively coupled with the first and second electric conductors to allow a current signal to flow between the first and second electric conductors Preferably, a portion of the substrate positioned under the movement region, a portion of the dielectric layer surrounding the movement region except where the hinge part is formed, and a portion of the substrate positioned under a portion of the dielectric layer surrounding the movement region, are selectively etched to provide an etched region for allowing the movement region to move up and down.

Preferably, the lower electrode is formed between the conductive layer and the hinge part, and anchors for respectively supporting the electric conductors and the upper electrode, and signal terminals applying signals to the electric conductors may further be included.

In still another embodiment of the present invention, a micro switch is provided, including a substrate, a dielectric layer formed on the substrate, the dielectric layer having a movement region formed of a predetermined portion of the dielectric layer that is capable of moving up and down by a hinge part formed on one side of the movement region, a conductive layer formed on a predetermined portion of the movement region, a dielectric film formed on the conductive layer, first and second electric conductors formed a predetermined distance above the dielectric film, and a piezoelectric layer formed on the movement region causing the conductive layer to move upwards by the supply of a predetermined voltage, and resistively coupled with the first and second electric conductors to allow an electric current to flow between the first and second electric conductors.

Preferably, a portion of the substrate positioned under the movement region, a portion of the dielectric layer surrounding the movement region except where the hinge part is formed, and a portion of the substrate positioned under a portion of the dielectric layer surrounding the movement region, are selectively etched to provide an etched region for allowing the movement region to move up and down.

The piezoelectric layer is preferably formed between the conductive layer and the hinge part, and anchors respectively supporting the electric conductors, signal terminals applying signals to the electric conductors, and piezoelectric electrode terminals applying a voltage to the piezoelectric layer may also be included.

Further, in yet another embodiment of the present invention, a micro switch is provided, including a substrate, a dielectric layer formed on the substrate, the dielectric layer having a movement region formed of a predetermined portion of the dielectric layer that is capable of moving up and down by hinge parts formed on either side of the movement region, a conductive layer formed on a predetermined portion of the movement region, first and second electric conductors formed a predetermined distance above the conductive layer, two lower electrodes formed on the movement region, and two upper electrodes formed a predetermined distance above the lower electrode, the upper electrodes causing the conductive layer to move upwards when an electrostatic force occurs between the upper electrodes and the lower electrodes, and resistively coupled with the first and second electric conductors to allow an electric current to flow between the first and second electric conductors.

Preferably, a portion of the substrate positioned under the movement region, a portion of the dielectric layer at both sides of the movement region, and a portion of the substrate positioned under a portion of the dielectric layer surrounding the movement region, are selectively etched to provide an etched region for allowing the movement region to move up and down.

Preferably, the lower electrodes are respectively formed between the conductive layer and the hinge parts at both sides of the conductive layer, and anchors respectively supporting the electric conductors, and signal terminals applying signals to the electric conductors may also be included.

Further, in yet another embodiment of the present invention, a micro switch is provided, including a substrate, a dielectric layer formed on the substrate, the dielectric layer having a movement region formed of a predetermined portion of the dielectric layer that is capable of moving up and down by a hinge part formed on one side of the movement region, a conductive layer formed on a predetermined portion of the movement region, first and second electric conductors formed a predetermined distance above the conductive layer, a lower electrode formed on the movement region, and an upper electrode formed a predetermined distance above the movement region, causing the conductive layer to move upwards when an electrostatic force is occurred between the lower electrode, and resistively coupled with the first and second electric conductors to allow a current signal to flow between the first and second electric conductors.

A portion of the substrate positioned under the movement region, a portion of the dielectric layer surrounding the movement region except where the hinge part is formed, and a portion of the substrate positioned under a portion of the dielectric layer surrounding the movement region, are selectively etched to provide an etched region for allowing the movement region to move up and down.

The lower electrode is formed between the conductive layer and the hinge part, and anchors respectively supporting the electric conductors and the upper electrode, and signal terminals applying signals to the electric conductors may be further included.

Further, in yet another embodiment of the present invention, a micro switch is provided, including a substrate, a dielectric layer formed on the substrate, the dielectric layer having a movement region formed of a predetermined portion of the dielectric layer that is capable of moving up and down by a hinge part formed on one side of the movement region, a conductive layer formed on a predetermined portion of the movement region, first and second electric conductors formed a predetermined distance above the conductive layer, and a piezoelectric layer formed on the movement region, causing the conductive layer to move upwards by the supply of a predetermined voltage, and resistively coupled with the first and second electric conductors to allow an electric current to flow between the first and second electric conductors.

A portion of the substrate positioned under the movement region, a portion of the dielectric layer surrounding the movement region except where the hinge part is formed, and a portion of the substrate positioned under a portion of the dielectric layer surrounding the movement region, are selectively etched to provide an etched region for allowing the movement region to move up and down.

The piezoelectric layer is formed between the conductive layer and the hinge part, and anchors respectively supporting the electric conductors, signal terminals applying signals to the electric conductors, and piezoelectric electrode terminals applying a voltage to the piezoelectric layer may be further included.

In all of the embodiments of the present invention, any of the conductive layer, the electric conductors, the lower electrode(s), the upper electrode(s), the anchor(s), the signal terminal(s) and the piezoelectric electrode terminal(s) is formed of one, or a combination of more than one selected from the group consisting of Au, Ag, Cu, Pt and Rd.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-49319, filed on Aug. 20, 2002, and entitled: "Electrostatic RF MEMS Switches," is incorporated by reference herein in its entirety Hereinafter, preferred embodiments of the present invention will be described with reference to the accompanying drawings.

Figure 1:
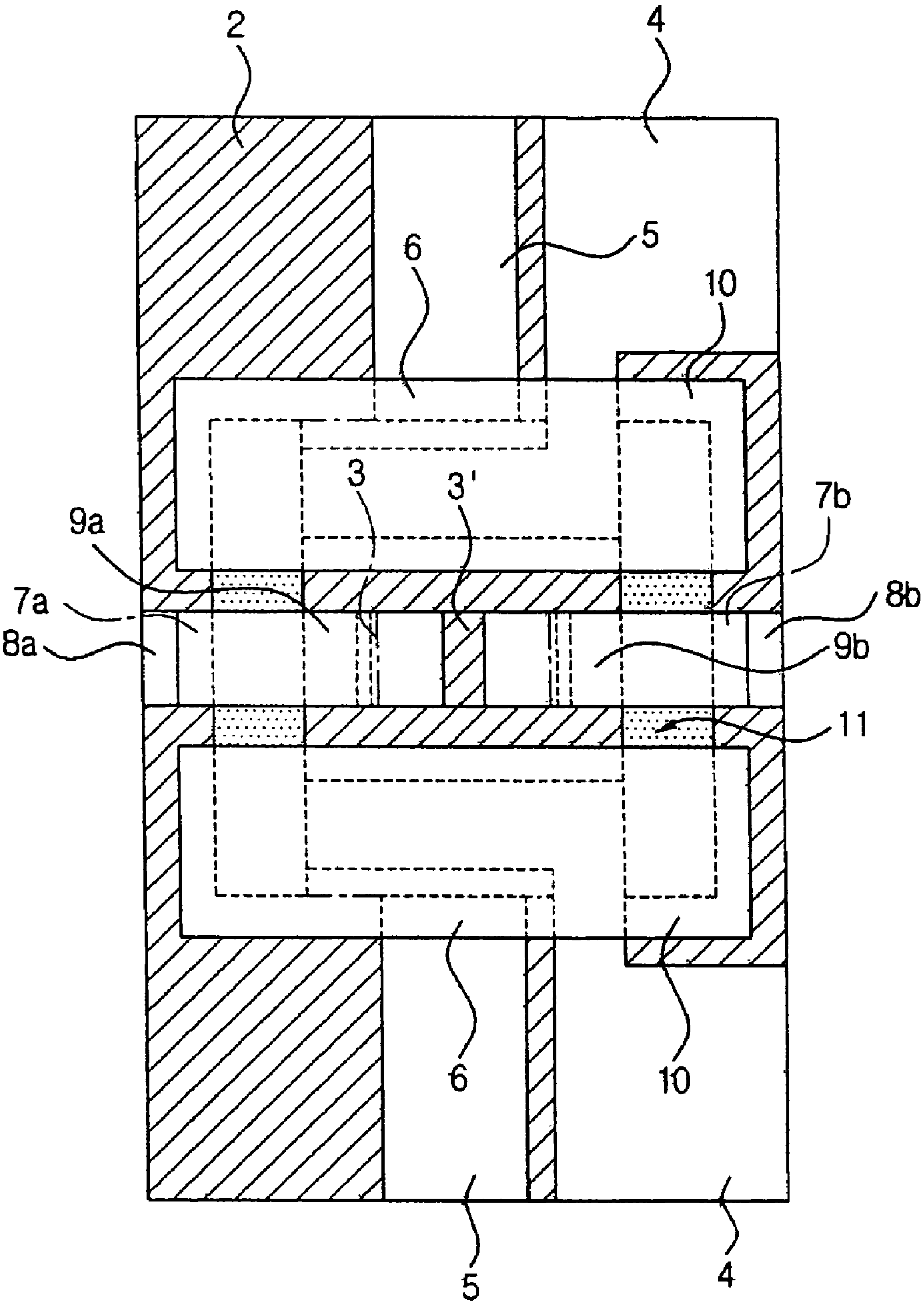
FIG. 1 illustrates a plan view for showing a micro switch according to a first embodiment of the present invention.
Figure 6:
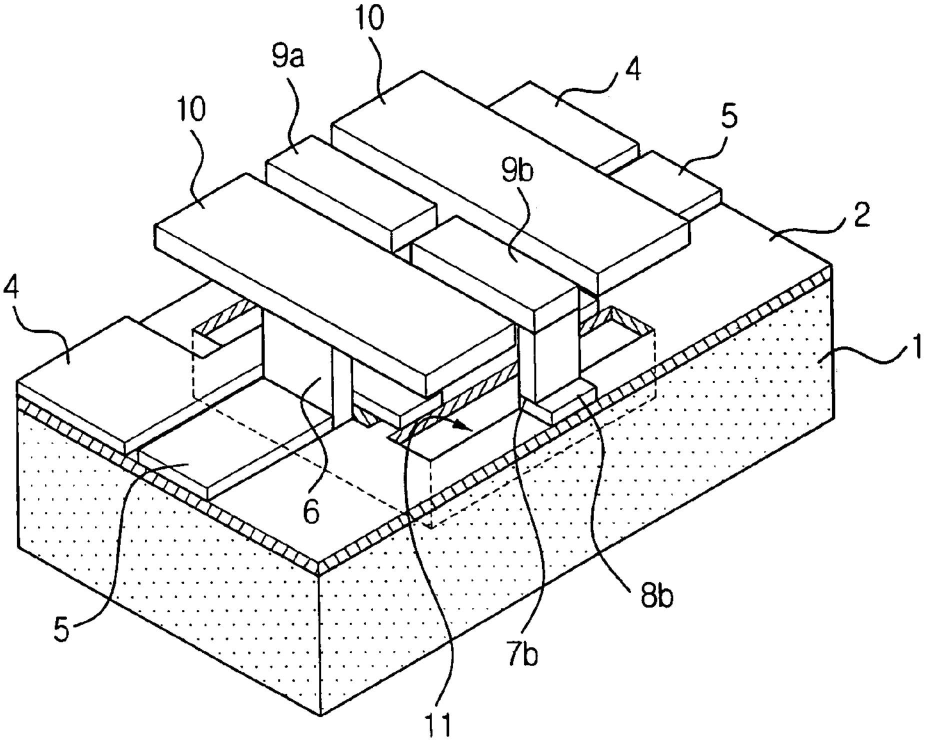
FIG. 6 illustrates a perspective view for showing the micro switch of FIG. 1.

FIG. 1 illustrates a plan view for showing a micro switch according to a first embodiment of the present invention, and FIG. 6 illustrates a perspective view for showing the micro switch of FIG. 1.

Figure 2:
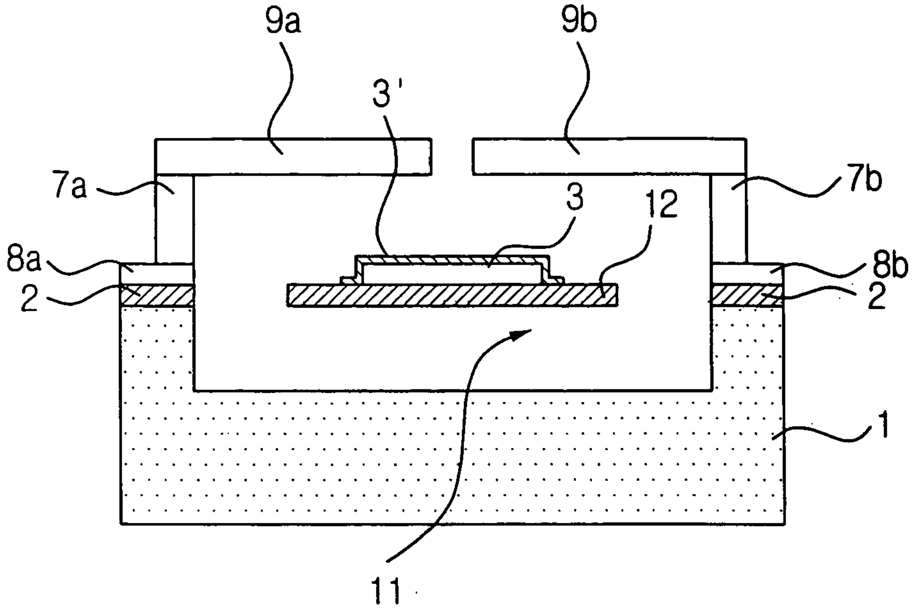
FIG. 2 illustrates a first side cross-sectional view for showing the off-state of the micro switch of FIG. 1.
Figure 3:
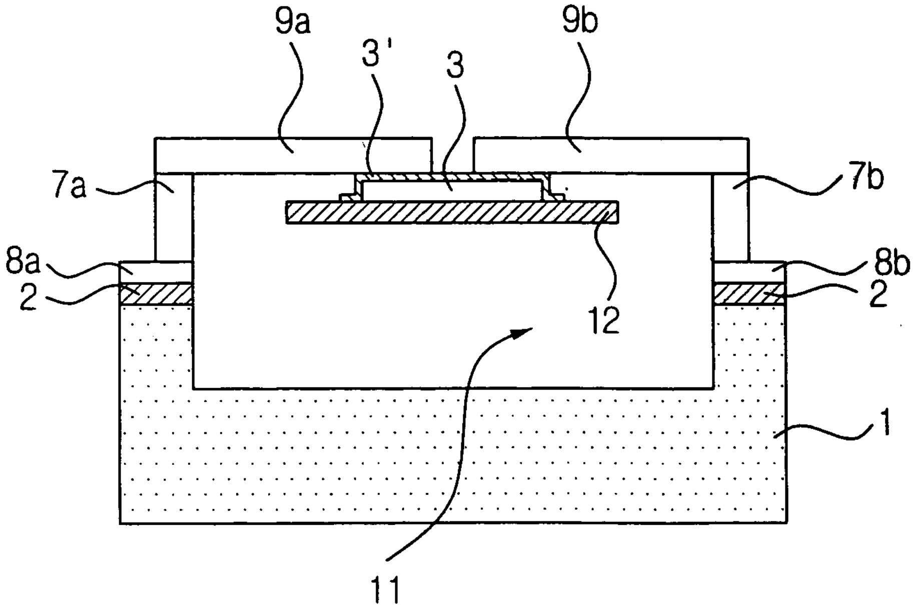
FIG. 3 illustrates a first side cross-sectional view for showing the on-state of the micro switch of FIG. 1.
Figure 4:
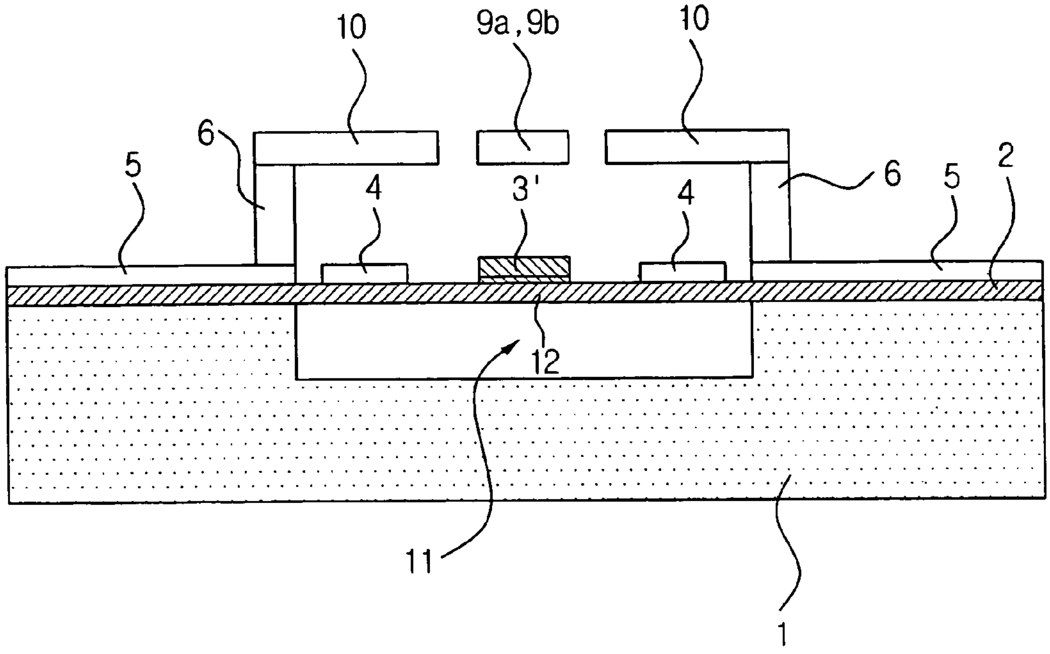
FIG. 4 illustrates a second side cross-sectional view for showing the off-state of the micro switch of FIG. 1.
Figure 5:
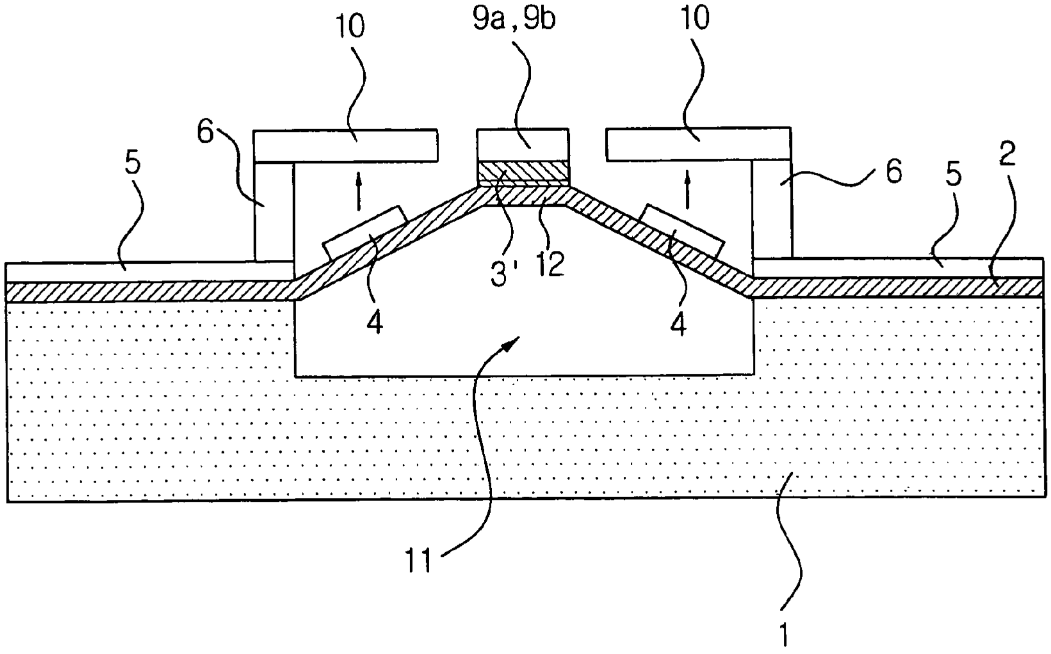
FIG. 5 illustrates a second side cross-sectional view for showing the on-state of the micro switch of FIG. 1.

Further, FIG. 2 and FIG. 4 illustrate cross-sectional views showing sides perpendicular to each other when the micro switch of FIG. 1 is in the off-state, and FIG. 3 and FIG. 5 illustrate cross-sectional views showing sides perpendicular to each other when the micro switch of FIG. 1 is in the on-state.

As shown in FIGS. 1 to 5, the micro switch according to a first embodiment of the present invention is a bridge-type electrostatic switch of a capacitively coupled structure.

A dielectric layer 2 is formed on a substrate 1. Either side of a central portion of the dielectric layer 2 are etched to form an etched region 11. The etched region 11 on either side of the central portion of the dielectric layer 2 is mutually communicated underneath the central portion of the dielectric layer 2, as shown in FIG. 2. A portion of the substrate 1 positioned under the central portion of the dielectric layer 2 is selectively etched to expand the etched region 11, as shown in FIGS. 4 and 5. The central portion of the dielectric layer 2 forms a movement region 12, which is capable of easily moving up and down due to the etched region 11 thereunder and on either side thereof. A portion of the dielectric layer 2 forming a hinge portion is etched to allow smooth upward and downward movement in the movement region 12.

A conductive layer 3 is formed on a predetermined central portion of the surface of the movement region 12 of the dielectric layer 2, and a dielectric film 3' is formed on the surface of the conductive layer 3.

First and second electric conductors 9*a* and 9*b* are separately disposed a predetermined distance above the conductive layer 3. The first and second electric conductors 9*a* and 9*b* are spaced apart from each other, but are mutually connected by the dielectric film 3' when the conductive layer 3 moves upwards.

In the meantime, as shown in FIGS. 4 and 5, lower electrodes 4 are respectively disposed at either end of the movement region 12 of the dielectric layer 2, between hinges formed on either side of the movement region 12 and the conductive layer 3.

Further, as shown in FIGS. 4 and 5, upper electrodes 10 are respectively disposed at positions spaced a predetermined distance over the lower electrodes 4, so an electrostatic force is generated if a predetermined dc voltage is applied between the lower electrodes 4 and the upper electrodes 10, causing the lower electrodes 4 to move toward the upper electrodes 10.

As shown in FIG. 2, the first and second electric conductors 9*a* and 9*b* are respectively supported by anchors 7*a* and 7*b*.

Further, as shown in FIGS. 4 and 5, the upper electrodes 10 are supported by upper electrode anchors 6, and the upper electrode anchors 6 are connected to upper electrode terminals 5.

As shown in FIGS. 3 and 5, in the micro switch having the above structure, if the lower electrodes 4 fixed at either side of the movement region 12 move upwards by an electrostatic force generated between the lower electrodes 4 and the upper electrodes 10, the dielectric film 3' at the central portion of the movement region 12 becomes connected to the first and second electric conductors 9*a* and 9*b*. At this time, capacitance between the conductive layer 3 and the first and second electric conductors 9*a* and 9*b* increases so that an electric signal between the first and second electric conductors 9*a* and 9*b* flows.

A micro switch according to a second embodiment of the present invention is a cantilever switch of a capacitively coupled structure, which will be described with reference to FIG. 8.

Figure 8:
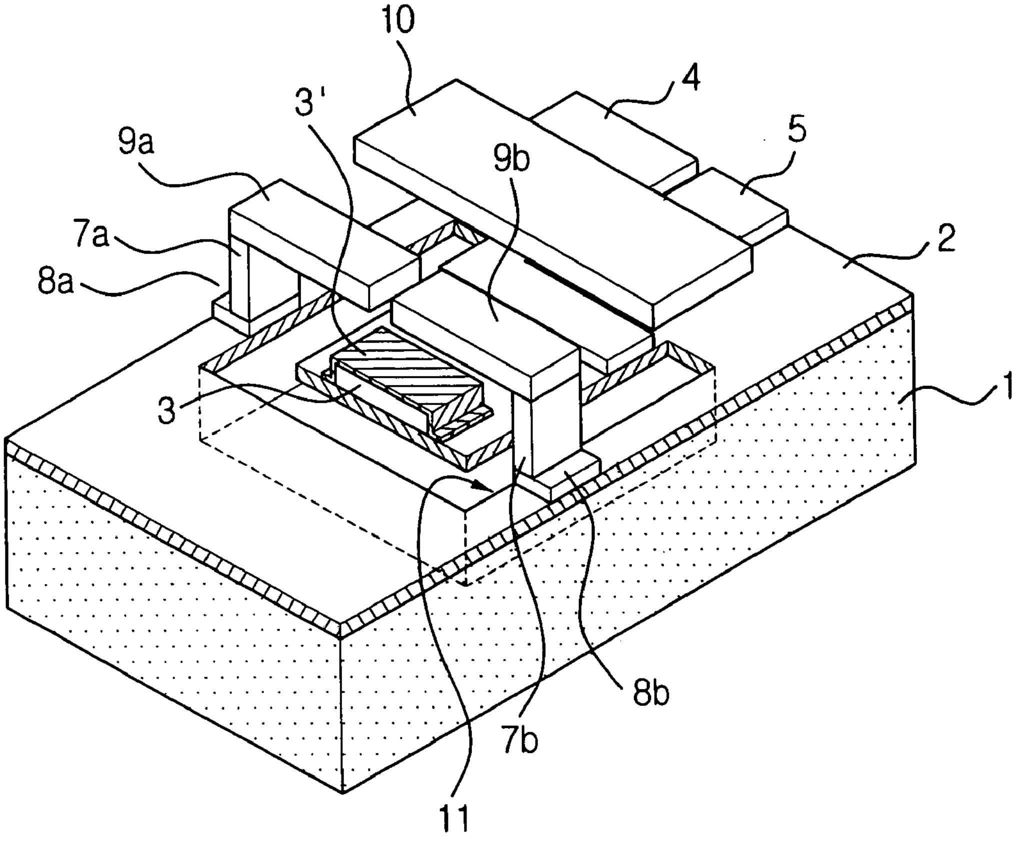
FIG. 8 illustrates a perspective view for showing a micro switch according to another embodiment of the present invention.

As shown in FIG. 8, the electrostatic cantilever switch of a capacitively coupled structure according to the second embodiment of the present invention has a single lower electrode 4, a single upper electrode 10, and a single upper electrode terminal 5 formed only at one end of the movement region 12, to one side of a conductive layer 3. There is also not shown in FIG. 8 a single upper electrode anchor disposed between the upper electrode terminal 5 and the upper electrode 10 for supporting the upper electrode 10, which corresponds to one of the upper electrode anchors 6 of the first embodiment illustrated in FIGS. 4 and 5. The lower electrode 4, upper electrode 10, upper electrode anchor and upper electrode terminal 5, which are disposed at only one side of the conductive layer 3 in the second embodiment, were disposed at either side of the conductive layer 3 in the first embodiment.

Further, a hinge part is formed at the side of the conductive layer 3 opposite the side at which the lower electrode 4, upper electrode 10, upper electrode anchor and upper electrode terminal 5 are formed, thereby allowing the lower electrode 4 to move upwards with respect to the hinge part.

The remaining elements and operations of the micro switch having the structure of the second embodiment are the same as those of the first embodiment of the present invention.

A micro switch according to a third embodiment of the present invention is a piezoelectric cantilever switch of a capacitively coupled structure, which will be described with reference to FIG. 9.

Figure 9:
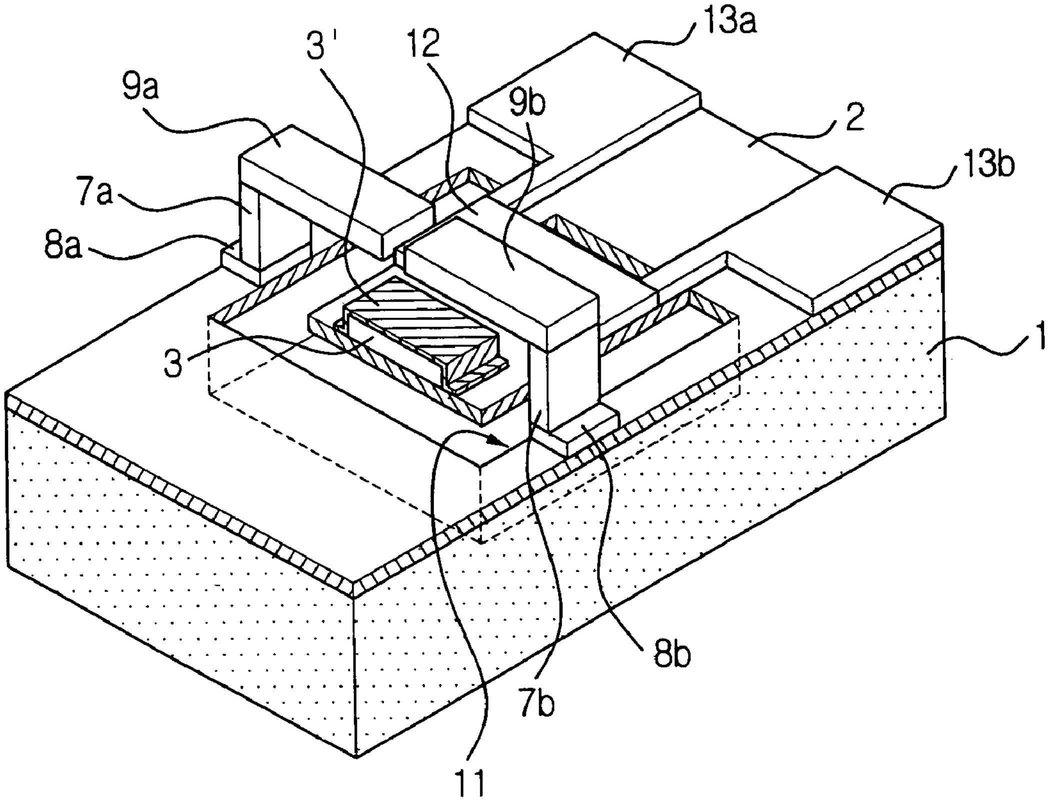
FIG. 9 illustrates a perspective view for showing a micro switch according to yet another embodiment of the present invention.

As shown in FIG. 9, the piezoelectric cantilever switch of a capacitively coupled structure according to the third embodiment of the present invention has the structure that can be obtained when the upper electrode 10, the lower electrode 4, the upper electrode anchors 6 and the upper electrode terminals 5 are removed from the structure appearing in the structure according to the second embodiment, while a piezoelectric film 12 is formed instead of the lower electrode 4, and piezoelectric electrode terminals 13*a*, 13*b* are formed to the piezoelectric layer 12 to apply voltage to the piezoelectric layer 12.

In the micro switch as shown in FIG. 9 according to the third embodiment of the present invention, as a predetermined voltage is applied through the piezoelectric electrode terminals 13*a*, 13*b* to the piezoelectric layer 12 fixed between the hinge of the movement region 12 and the conductive layer 3, the dielectric film 3' moves upward to contact with the first electric conductor 9*a* and the second electric conductor 9*b*. Accordingly, capacitance between the conductive layer 3 and the first and the second electric conductors 9*a*, 9*b* increases, and electric signals flow between the first and the second electric conductors 9*a*, 9*b*.

A fourth embodiment of the present invention is a bridge-type switch of a resistively coupled structure, which has a structure that the dielectric film 3' is removed from the upper surface of the conductive layer 3 appearing in the structure according to the first embodiment.

In the micro switch having the structure of the fourth embodiment, the conductive layer 3 at the central portion of the movement region 12 becomes connected to the first and second electric conductors 9*a* and 9*b* if the lower electrodes 4 fixed at either end of the movement region 12 move upwards by an electrostatic force between the lower electrodes 4 and the upper electrodes 10. At this time, electric resistance between the conductive layer 3 and the first and second electric conductors 9*a* and 9*b* is reduced, so an electric signal between the first and second electric conductors 9*a* and 9*b* flows.

A fifth embodiment of a micro switch according to the present invention is a cantilever switch of a resistively coupled structure, having a structure that the dielectric film 3' on the conductive layer 3 is removed from the structure of the above second embodiment of the present invention. The remaining elements of the micro switch of the fifth embodiment are the same as those of the second embodiment of the present invention.

A sixth embodiment of a micro switch according to the present invention is a piezoelectric cantilever switch of a resistively coupled structure, having a structure that the dielectric film 3' is removed from the structure of the above third embodiment of the present invention.

Operations of the micro switch having the structure of the sixth embodiment as described above are the same as those of the third embodiment of the present invention.

A process for the micro switch according to the first embodiment of the present invention will now be described with reference to FIGS. 7A to 7E.

Figure 7A:
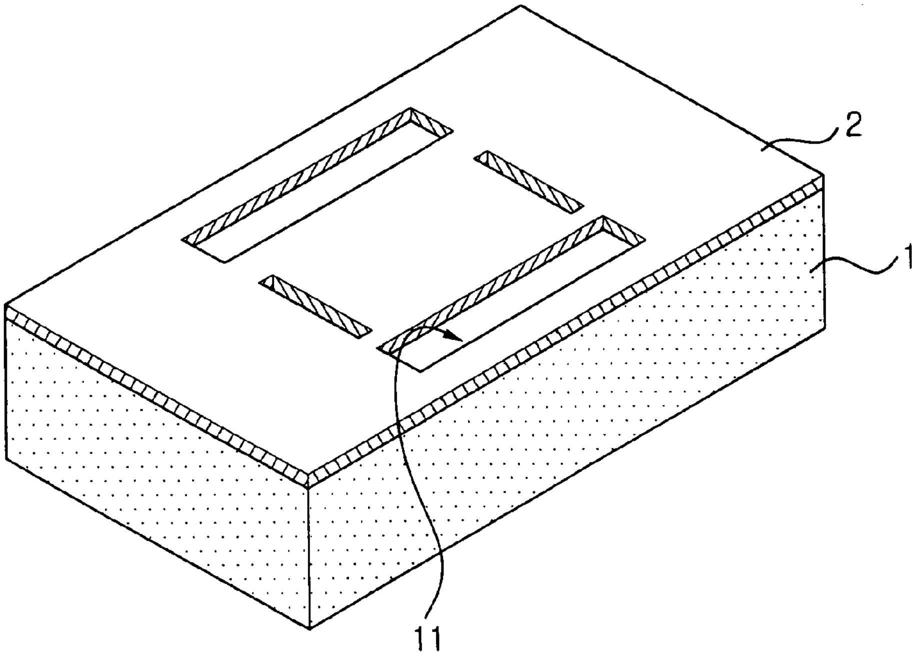
FIG. 7A to FIG. 7E illustrate views for showing a process for forming a micro switch according to an embodiment of the present invention.

As shown in FIG. 7A, a dielectric layer 2 is formed on an upper surface of the substrate 1. FIG. 7A shows etched regions 11 to aid in understanding a three dimensional structure of the micro switch according to the present invention, but the etched regions 11 are formed at a final step of the process, at which time a central portion of the dielectric layer 2 has a densely formed plurality of via holes (not shown) formed therein.

Figure 7B:
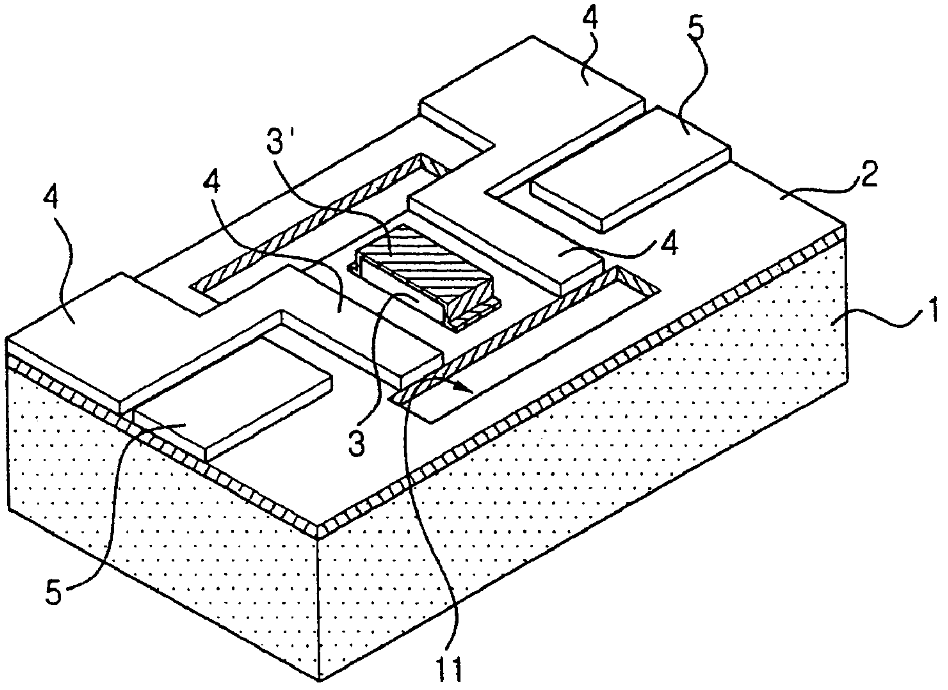

As shown in FIG. 7B, a conductive layer 3 is formed on the central portion of the dielectric layer 2, and a dielectric film 3' is formed on the conductive layer 3. The conductive layer 3 may be formed of one, or a proper combination of Au, Ag, Cu, Pt and Rd, which have excellent electric conductivities.

Further, electrode terminals 5, lower electrodes 4 and signal terminals 8*a*, 8*b* are formed opposite each other on the dielectric layer 2 at either side of the conductive layer 3.

Figure 7C:
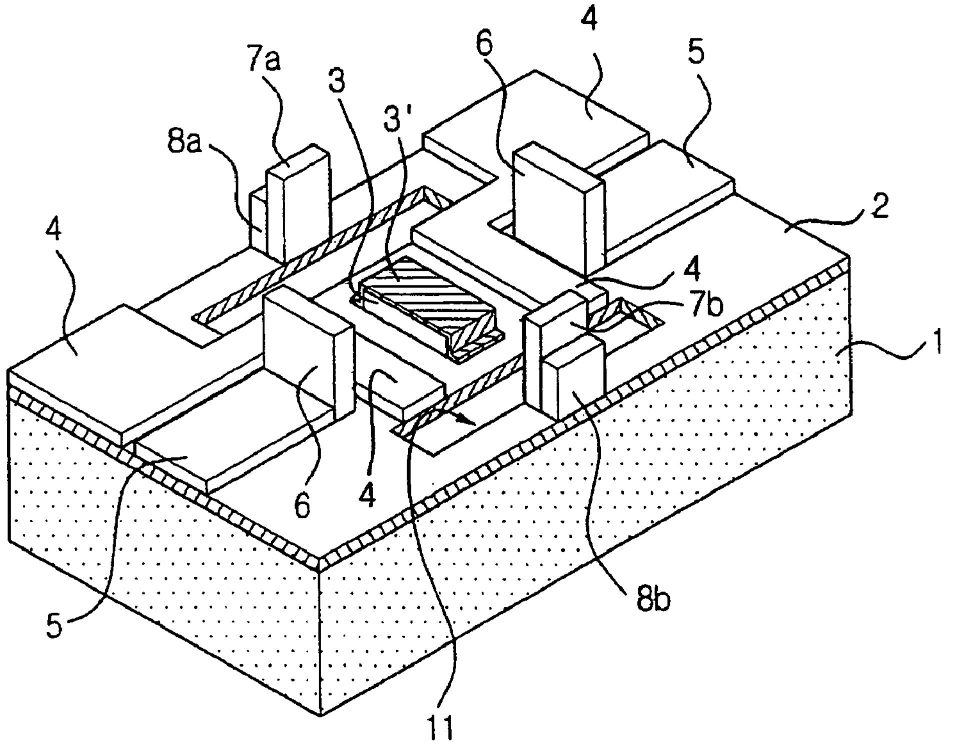

Then, as shown in FIG. 7C, patterns are formed for anchors 7*a* and 7*b* for respectively supporting first and second electric conductors and for upper electrode anchors 6.

Figure 7D:
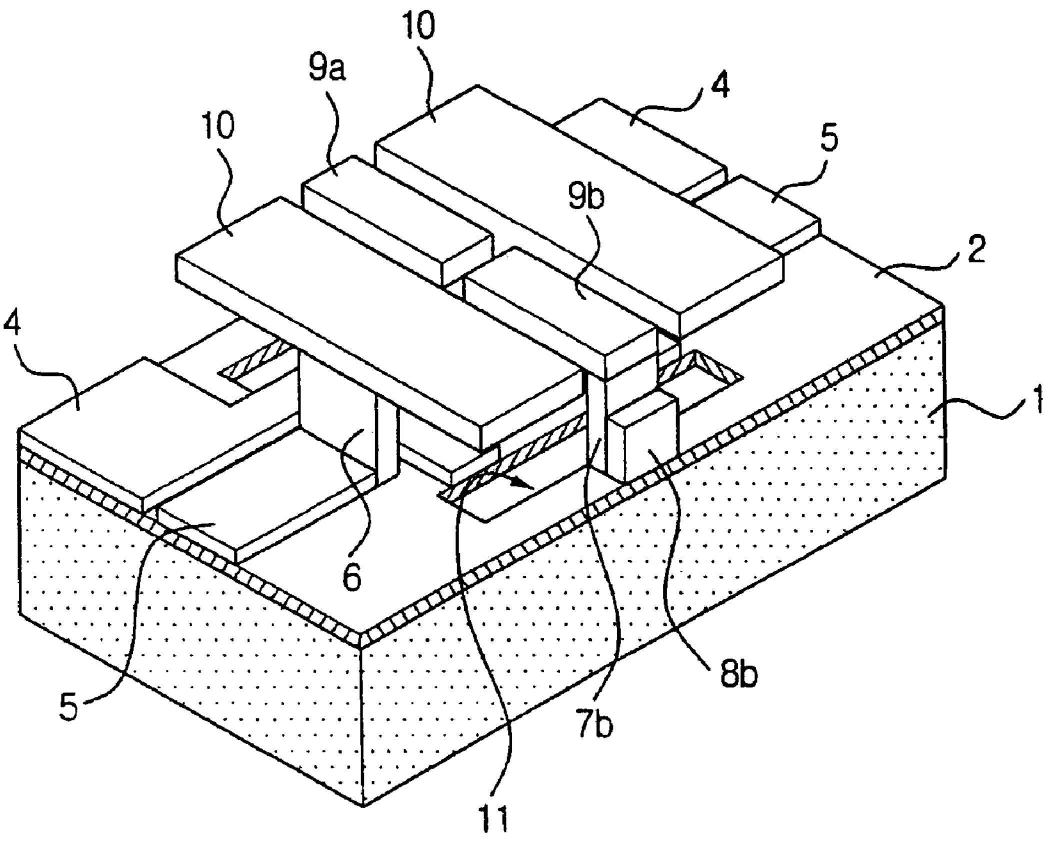

Subsequently, as shown in FIG. 7D, patterns are formed for first electric conductor 9*a*, second electric conductor 9*b*, and upper electrode 10.

Figure 7E:
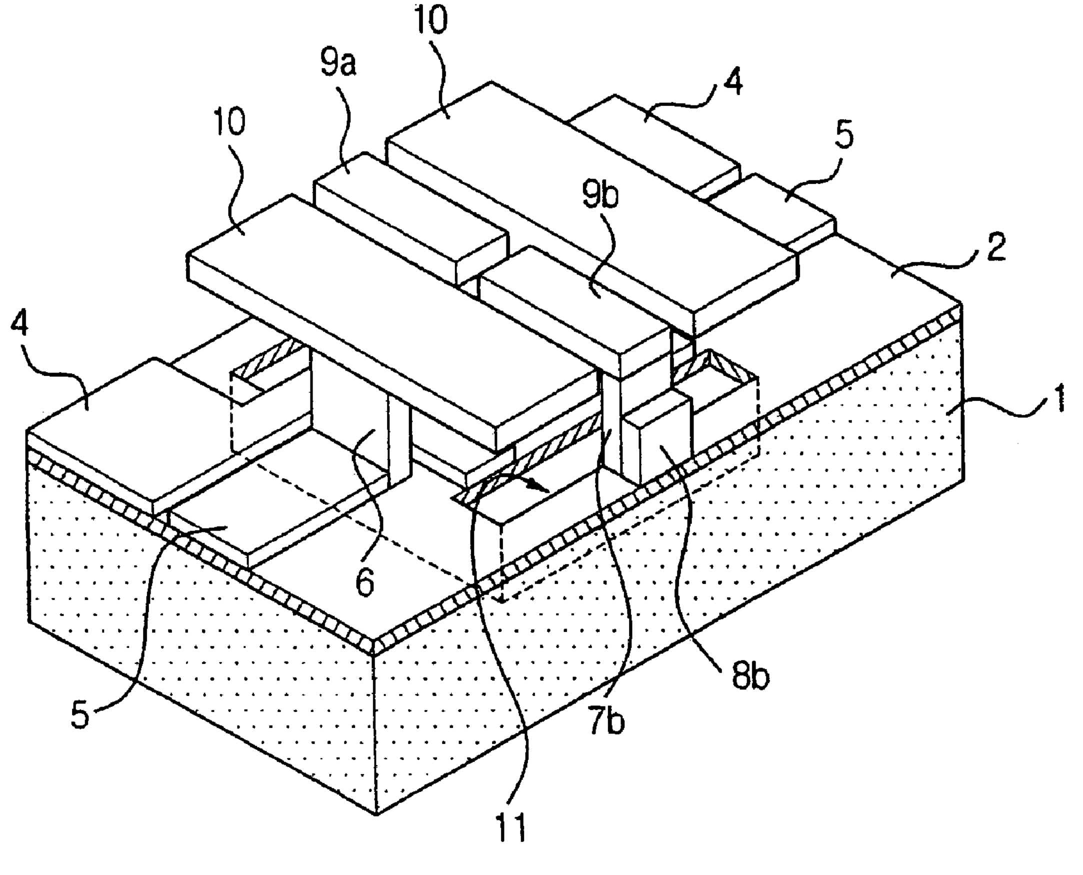

At the final step, as shown in FIG. 7E, the etched regions 11 are formed by a dry etching method in which the plurality of via holes are densely formed in the central portion of the dielectric layer 2. At this time, the etched regions 11 are connected to each other underneath the central portion of the dielectric layer 2.

In the above embodiment, the upper electrode 10 has a rectangular shape, as shown in FIGS. 7D and 7E, and the upper electrode anchors 6 for supporting the upper electrodes 10 are positioned at outer ends of the upper electrodes 10, as shown in FIGS. 4 and 5. However, the shape of the upper electrodes 10 may be diversely transformed, and the positions of the upper electrode anchors 6 for supporting the upper electrodes 10 may be changed.

The micro switch according to the present invention has a simple structure, as well as a high on/off ratio and isolation degree, and may be fabricated in a very easy process.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

The invention claimed is:

1. A micro switch, comprising:

a substrate;

a dielectric layer formed on the substrate, the dielectric layer having a movement region formed of a predetermined portion of the dielectric layer that is capable of moving up and down by a hinge part formed on one side of the movement region;

a conductive layer formed on a predetermined portion of the movement region;

first and second electric conductors formed a predetermined distance above the conductive layer;

a piezoelectric layer formed on the movement region, causing the conductive layer to move upwards by the supply of a predetermined voltage, and resistively coupled with the first and second electric conductors to allow a current signal to flow between the first and second electric conductors; and a dielectric film formed on the conductive layer.

2. The micro switch as claimed in claim 1, wherein a portion of the substrate positioned under the movement region, a portion of the dielectric layer surrounding the movement region except where the hinge part is formed, and a portion of the substrate positioned under a portion of the dielectric layer surrounding the movement region, are selectively etched to provide an etched region for allowing the movement region to move up and down.

3. The micro switch as claimed in claim 1, wherein the piezoelectric layer is formed between the conductive layer and the hinge part.

4. The micro switch as claimed in claim 1, further comprising anchors respectively supporting the electric conductors, signal terminals applying signals to the electric conductors, and piezoelectric electrode terminals applying a voltage to the piezoelectric layer.

5. The micro switch as claimed in claim 4, wherein any of the conductive layer, the electric conductors, the anchors, the signal terminals and the piezoelectric electrode terminals is formed of one, or a combination of more than one selected from the group consisting of Au, Ag, Cu, Pt and Rd.

6. A micro switch, comprising:

a substrate;

a dielectric layer formed on the substrate, the dielectric layer having a movement region formed of a predetermined portion of the dielectric layer that is capable of moving up and down by a hinge part formed on one side of the movement region;

a conductive layer formed on a predetermined first portion of the movement region;

first and second electric conductors formed a predetermined distance above the conductive layer; and a piezoelectric layer formed on a second portion of the movement region, causing the conductive layer to move upwards by the supply of a predetermined voltage, and resistively coupled with the first and second electric conductors to allow a current signal to flow between the first and second electric conductors, wherein the second portion of the movement region corresponds to a portion of the movement region other than the predetermined first portion of the movement region.

7. The micro switch as claimed in claim 6, wherein a portion of the substrate positioned under the movement region, a portion of the dielectric layer surrounding the movement region except where the hinge part is formed, and a portion of the substrate positioned under a portion of the dielectric layer surrounding the movement region, are selectively etched to provide an etched region for allowing the movement region to move up and down.

8. The micro switch as claimed in claim 6, wherein the piezoelectric layer is formed between the conductive layer and the hinge part.

9. The micro switch as claimed in claim 6, further comprising anchors respectively supporting the electric conductors, signal terminals applying signals to the electric conductors, and piezoelectric electrode terminals applying a voltage to the piezoelectric layer.

10. The micro switch as claimed in claim 9, wherein any of the conductive layer, the electric conductors, the anchors, the signal terminals and the piezoelectric electrode terminals is formed of one, or a combination of more than one selected from the group consisting of Au, Ag, Cu, Pt and Rd.

11. A micro switch, comprising:

a substrate having a recessed portion;

a dielectric layer formed on the substrate, the dielectric layer having a protruding movement region that protrudes from a non-movement region of the dielectric layer, the protruding movement region being connected to the non-movement region via a pivoting means provided between the non-movement region and the protruding movement region of the dielectric layer, the protruding movement region protruding from the non-movement region and extending over the recessed portion of the substrate such that the protruding movement region is free to pivot about the pivoting means;

a conductive layer formed on a predetermined portion of the protruding movement region;

first and second electric conductors formed a predetermined distance above the conductive layer; and a piezoelectric layer formed on the protruding movement region, causing the conductive layer to move upwards by the supply of a predetermined voltage, and resistively coupled with the first and second electric conductors to allow a current signal to flow between the first and second electric conductors.

12. The micro switch as claimed in claim 11, wherein the pivoting means is a portion of the dielectric layer continuously extending between the non-movement region and the protruding movement region of the dielectric layer.

13. The micro-switch as claimed in claim 11, wherein the piezoelectric layer overlaps a portion of the protruding movement region other than a portion of the protruding movement region that the conductive layer overlaps.

* * * * *